(12) United States Patent
Ausserlechner

(10) Patent No.: US 11,874,140 B2
(45) Date of Patent: Jan. 16, 2024

(54) TAPERED MAGNET

(71) Applicant: Infineon Technologies AG, Neubiberg (DE)

(72) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/369,070

(22) Filed: Dec. 5, 2016

(65) Prior Publication Data

US 2017/0234700 A1   Aug. 17, 2017

Related U.S. Application Data

(63) Continuation-in-part of application No. 15/045,888, filed on Feb. 17, 2016, now abandoned.

(51) Int. Cl.
| | |
|---|---|
| *G01D 5/14* | (2006.01) |
| *G01R 33/07* | (2006.01) |
| *G01R 33/00* | (2006.01) |
| *G01D 5/16* | (2006.01) |
| *G01R 33/09* | (2006.01) |

(52) U.S. Cl.
CPC .............. *G01D 5/145* (2013.01); *G01D 5/16* (2013.01); *G01R 33/0005* (2013.01); *G01R 33/077* (2013.01); *G01R 33/091* (2013.01)

(58) Field of Classification Search
CPC .... G01D 5/142; G01R 15/207; G01R 33/072; G01R 33/07; G01R 33/022
See application file for complete search history.

(56) References Cited

U.S. PATENT DOCUMENTS

| | | | | |
|---|---|---|---|---|
| 2002/0021124 A1* | 2/2002 | Schott | .................... | G01D 5/145 324/207.2 |
| 2003/0094941 A1* | 5/2003 | Mizutani | ................ | G01D 5/145 324/207.2 |
| 2004/0000902 A1* | 1/2004 | Tokunaga | .............. | G01D 5/145 324/207.2 |
| 2006/0042405 A1* | 3/2006 | Ishihara | .................. | G01L 3/104 73/862.333 |
| 2009/0045807 A1* | 2/2009 | Nishida | .................. | G01D 5/145 324/207.2 |

(Continued)

FOREIGN PATENT DOCUMENTS

| | | |
|---|---|---|
| CN | 101421635 A | 4/2009 |
| CN | 105258633 A | 1/2016 |

(Continued)

OTHER PUBLICATIONS

Office Action dated Feb. 2, 2019 for Chinese Patent Application No. 201710086104.2.

(Continued)

*Primary Examiner* — Alvaro E Fortich
*Assistant Examiner* — Adam S Clarke
(74) *Attorney, Agent, or Firm* — Banner & Witcoff Ltd.

(57) ABSTRACT

A magnet for a magnetic angle sensing system, the magnet having a tapered geometry in parallel with a rotation axis of the magnet, and configured to be mounted to a rotatable member such that a thin end of the magnet is closer to a magnetic field sensing element located on the rotation axis than a broad end of the magnet.

20 Claims, 6 Drawing Sheets

(56) References Cited

U.S. PATENT DOCUMENTS

| | | | |
|---|---|---|---|
| 2009/0309590 A1* | 12/2009 | Kataoka | G01R 33/0011 324/244 |
| 2010/0315074 A1* | 12/2010 | Abe | G01D 5/145 324/207.25 |
| 2011/0234037 A1* | 9/2011 | Petro | H02K 1/14 310/156.38 |
| 2014/0266158 A1* | 9/2014 | Zwijze | G01B 7/30 324/207.2 |
| 2015/0022191 A1* | 1/2015 | Ausserlechner | G01R 33/02 324/207.21 |
| 2015/0022192 A1* | 1/2015 | Ausserlechner | G01D 5/145 324/207.25 |
| 2015/0184704 A1* | 7/2015 | Aschoff | F16D 59/02 188/161 |
| 2015/0354984 A1* | 12/2015 | Albrecht | G01D 5/2451 324/207.2 |
| 2015/0362565 A1* | 12/2015 | Sanfilippo | G01R 33/0005 324/251 |
| 2016/0011010 A1* | 1/2016 | Muthers | G01D 5/145 324/207.2 |
| 2016/0209241 A1* | 7/2016 | Mitsuhashi | G01D 5/34792 |
| 2016/0265940 A1* | 9/2016 | Burgdorf | B60T 8/171 |
| 2016/0275744 A1* | 9/2016 | Ueyama | G01N 27/72 |

FOREIGN PATENT DOCUMENTS

| | | | | |
|---|---|---|---|---|
| DE | 19637077 A1 | 3/1998 | | |
| DE | 10133542 A1 | 2/2002 | | |
| DE | 10328616 A1 | 2/2004 | | |
| DE | 60028472 T2 | 1/2007 | | |
| DE | 102006020700 A1 * | 11/2007 | | G01D 5/145 |
| DE | 102008040360 A1 | 1/2010 | | |
| DE | 102014200365 A1 | 5/2015 | | |
| DE | 102014109693 A1 | 1/2016 | | |
| JP | H11261131 A | 9/1999 | | |
| JP | 2000349363 A | 12/2000 | | |
| JP | 2012005260 A * | 1/2012 | | |

OTHER PUBLICATIONS

Office Action dated Sep. 17, 2019 for Chinese Patent Application No. 201710086104.2.

Office Action dated Aug. 12, 2020 for German Patent Application No. 102017103181.2.

Office Action dated Apr. 13, 2021 issued for German Patent Application No. 102017103181.2.

* cited by examiner

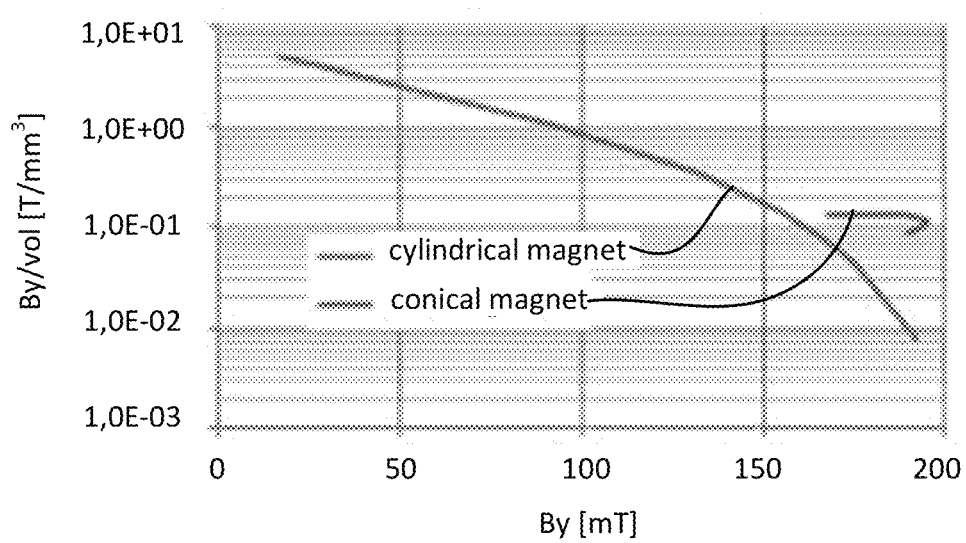

TAPERED MAGNET

BACKGROUND

This disclosure relates to a magnetic angle sensor, where a conical permanent magnet is attached to a rotatable shaft and a magnetic field sensor is placed on the rotation axis and ahead of the magnet. The sensor detects the rotatable magnetic field, which points in diametrical direction, and therefrom it infers the rotational position of the shaft.

Angle sensors include magnetoresistive (MR) angle sensors, which respond to magnetic field components in a plane perpendicular to a rotation axis. Several types of MRs are known: anisotropic magnetoresistance (AMR), Giant magnetoresistance (GMR), and tunnel magnetoresistance (TMR) angle sensors. Instead of MRs, a Vertical Hall device, which also detects magnetic field components perpendicular to the rotation axis, may be used.

A disadvantage of MRs and Vertical Hall devices is that they are very sensitive to magnetic disturbances, that is, if the magnet generates a magnetic field of 45 mT at the sensor element, a magnetic disturbance of 3 mT (in a worst case direction perpendicular to the axis and orthogonal to the field of the magnet) results in an error of arctan (3/45)=3.8°, which is generally not acceptable.

BRIEF DESCRIPTION OF THE DRAWINGS

FIG. 2C illustrates a graph of a ratio of magnetic field density divided by volume of magnet versus distance for cylindrical and conical magnets.

DETAILED DESCRIPTION

The present disclosure is directed to a magnet for a magnetic angle sensing system, the magnet having a tapered geometry in parallel with a rotation axis of the magnet, and configured to be mounted to a rotatable member such that a thin end of the magnet is closer to a field sensing element located on the rotation axis than a broad end of the magnet. The magnet is stronger than known magnets, such as cylindrical magnets, and applies a magnetic field of 195 mT on the magnetic field sensing element, and decreases an error by a factor of 4.3 down to 0.9°.

Figure 1A:
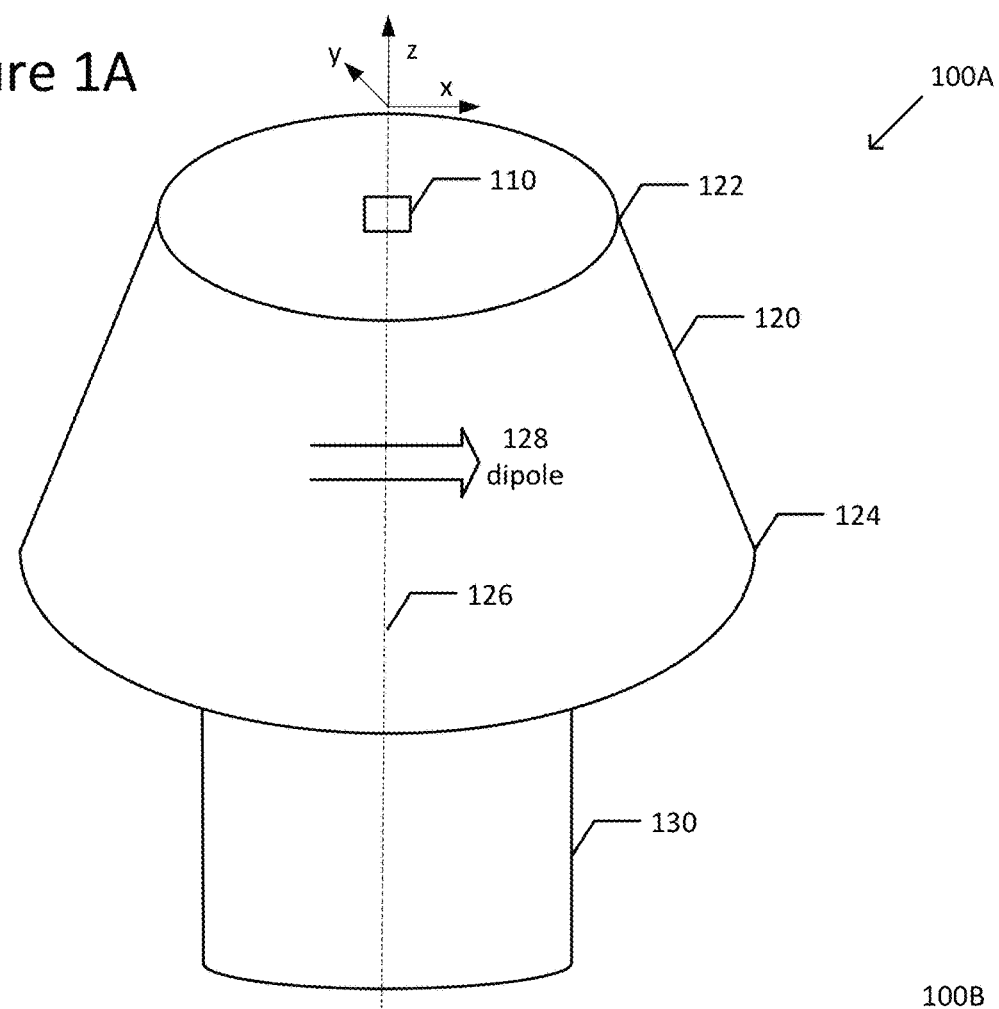
FIG. 1A illustrates a perspective view of a magnetic angle sensing system in accordance with an embodiment of this disclosure.
Figure 1B:
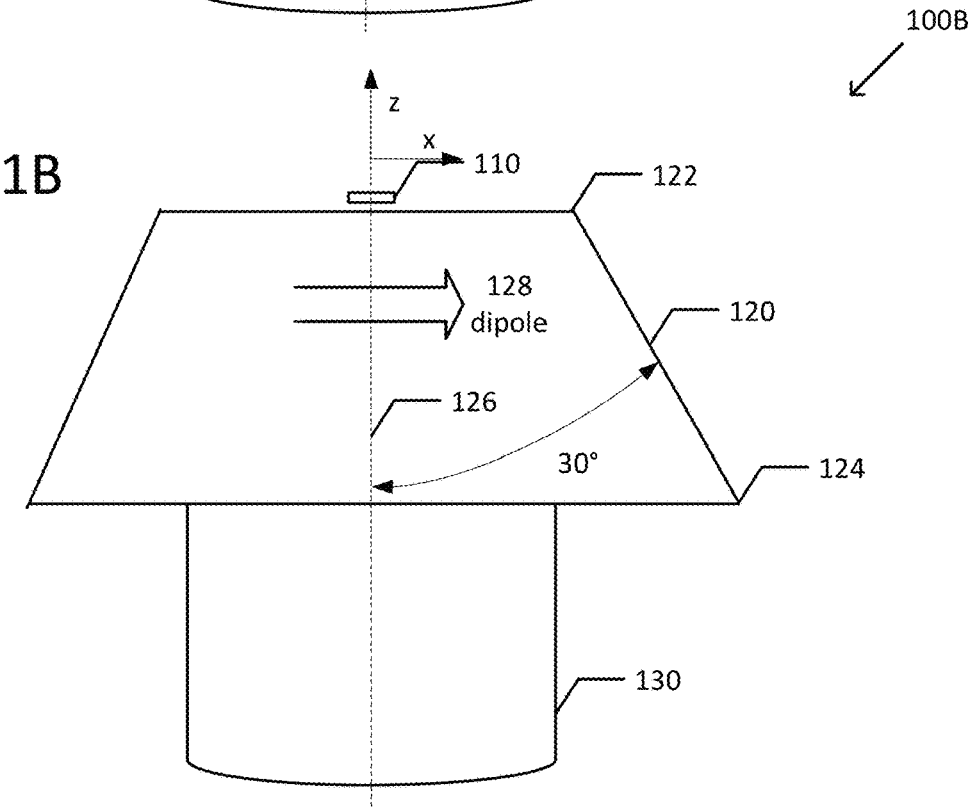
FIG. 1B illustrates an elevation view of the magnetic angle sensing system of FIG. 1A.

FIG. 1A illustrates a perspective view of a magnetic angle sensing system 100A in accordance with an embodiment of this disclosure. FIG. 1B illustrates an elevation view of the magnetic angle sensing system 100B of FIG. 1A.

The magnetic angle sensing system 100 includes a magnetic field sensing element 110, a magnet 120, and a shaft 130.

The magnetic field sensing element 110 is configured to sense a magnetic field. The magnetic field sensing element 110 may be an XMR angle sensor selected from the group of angle sensors consisting of: anisotropic magnetoresistance (AMR), Giant magnetoresistance (GMR), and tunnel magnetoresistance (TMR) angle sensors. Alternatively, the magnetic field sensing element 110 may be a Vertical Hall device.

The sensing element 110 may be located on a die with dimensions of approximately Lx×Ly×Lz being 1.5 mm×1.5 mm×0.2 mm size. The sensing element 110 is located on the rotation axis in an axial distance of approximately 2 mm from the surface of the magnet 120.

The magnetic field sensing element 110 is configured to sense a direction of a magnetic field, but not necessarily a strength of the magnetic field. However, when combining magnetic field sensing elements 110, which are sensitive to a magnetic field strength, as orthogonal Hall plates, the magnetic field sensing elements 110 will sense both magnetic field strength and also magnetic field direction.

The magnet 120 is rotatable around a rotation axis 126 and with respect to the magnetic field sensing element 110. The magnet 120 is conical in shape in that it has a tapered geometry in parallel with the rotation axis 126 with a thin end 122 located closer to the magnetic field sensing element 110 than a broad end 124.

The magnet 120, like the known magnets, is homogeneously magnetized in diametrical direction (i.e., the y-direction). The magnet 120 may have an outer diameter of approximately 20 mm. The magnet 120 may have a half-aperture angle of approximately 30°. The magnet 120 may be comprised of a strongest possible material, for example, anisotropic NdFeB with 1.2 T remanence. The magnet may be a sintered type or a pressed type or an injection molded type, whereby the sintered type has the largest magnetization. The magnet may be isotropic or anisotropic, and in the latter case, the magnet may be pressed in a dry or wet condition, whereby anisotropic magnets are stronger than isotropic ones. The magnet 120 applies a maximum magnetic field to a magnetoresistance angle sensor on a plain surface perpendicular to the rotation axis.

The conical angle can be optimized to maximize the magnetic field on the sensing element 110. An angle of 30° results in a maximum magnetic field. The ratio of magnetic field over magnet volume has another maximum near 45°.

The shaft 130 is rotatable. The broad end 124 of the magnet 120 is affixed to an end of the rotatable shaft 130. The shaft 130 is assumed to be comprised of a non-magnetic material with a diameter of more than 8 mm. However, the shaft 130 may alternatively be comprised of a ferrous material and have a different diameter.

Figure 2A:
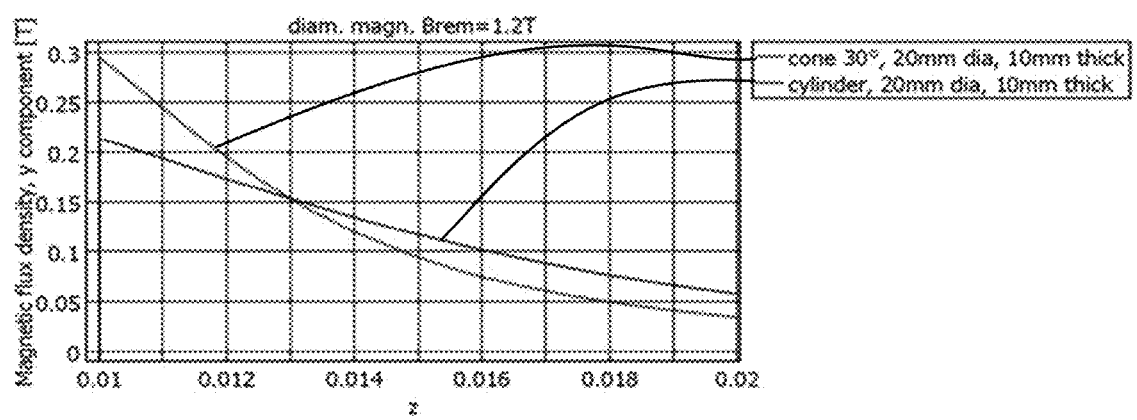
FIG. 2A illustrates a graph of magnetic flux density versus distance.
Figure 2B:
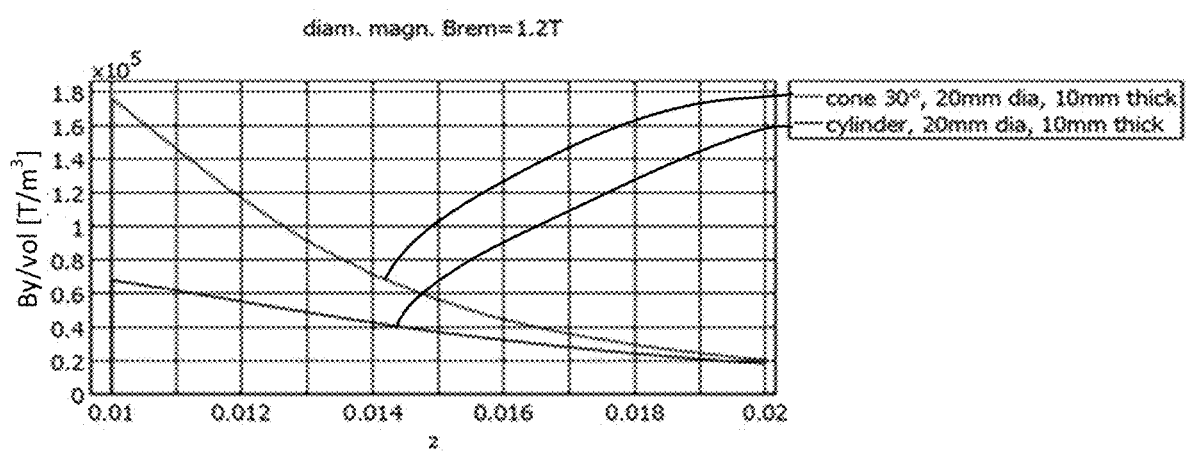
FIG. 2B illustrates a graph of a ratio of magnetic flux density divided by volume of magnet versus distance.

FIG. 2A illustrates a graph 200A of magnetic flux density versus distance, and FIG. 2B illustrates a graph 200B of ratio of magnetic flux density divided by volume of magnet versus distance. FIGS. 2A and 2B show the diametrical flux density By on the rotation axis, which is identical to the symmetry axis of the bodies of rotational symmetry, versus the z-position, whereby 0.01 m is the top surface of the magnet 120 and z=0.012 m is the z-position of the magnetic field sensing element 110. Two curves for two geometries of the magnet are shown: the cone 30° is shown in FIGS. 1A and 1B and the cylinder means a magnet in the shape of a cylinder with 20 mm diameter and 10 mm axial length. Both magnets are supposed to have the same remanence Brem=1.2 T and both are magnetized in the diametrical direction.

For axial distances of less than 3 mm between the sensing element 110 and the top surface 122 of the magnet 120, the conical magnet 120 has a larger magnetic field, whereas for larger distances the magnet 120 has a smaller magnetic field. Both properties are advantageous for practical applications, because a larger magnetic field on the sensing element 110 is desirable, whereas a smaller magnetic field for larger distances, because of rotating field of the magnet 120 usually disturbs other nearby equipment and magnetizes ferrous nearby objects, whose secondary magnetic field then disturbs the angle sensor. In the z=0.012 m, the conical magnet 120 has a 14% larger magnetic field than a cylindrical magnet. This may seem to be only a small improvement in magnetic field strength, however, it is significant, related to the mass or volume of the magnet 120.

At the sensing location this ratio is roughly 2 (1.2E5 T/m$^3$ over 0.6E5 T/m$^2$) and the mass of the conical magnet 120 is only 53% of the mass of the cylindrical magnet. This means a significant reduction in cost. Moreover it may be advantageous for various practical angle sensing systems to have a light-weight magnet with a smaller inertia moment, particularly if the shaft 130 is driven by a weak motor and/or the shaft 130 needs to be highly dynamic.

The production of the conical magnet 120 is not much different than that of the cylindrical magnet. In both cases the raw material powder, such as of a rare-earth material or anisotropic permanent magnetic material, may be filled in a cavity and optionally pressed in the presence of a magnetic field; and then the magnet 120 is sintered and magnetized. Alternatively, the magnet may be simply pressed or injection molded, although such magnets are generally weaker than sintered ones. These production methods are merely examples and not meant to be limited.

FIG. 2C illustrates a graph 200C of a ratio of magnetic field density divided by volume of magnet versus distance for cylindrical and conical magnets. In the graph, the cylindrical magnet is represented by the larger line, and the conical magnet is represented by the smaller line. The conical magnet 120 has larger By-field at larger By/volume-ratio than a cylindrical one.

The conical magnet 120 is advantageous in that it can be mounted (e.g., glued) to the flat end of a shaft 130 via its wide end 124, which leads to more accurate mounting, that is, less assembly tolerances like eccentricities and tilt angles, than if the magnet 120 were mounted to the shaft 130 via its narrow end 122.

The magnet 120 is ideally magnetized homogeneously, that is, its magnetization points in a same direction and it has the very same strength throughout the body of the magnet 120. Of course, in reality there are some unavoidable deviations from this idealized case, that is, the direction of the magnetization slightly deviates from the diametrical direction near the perimeter and edges of the geometry. There is in reality a flower-state, deviating in all directions around the ideal one. The homogenous magnetization is preferred because it is easier to produce it instead of inhomogeneous types of magnetization. Regardless of the homogeneity of the magnet, magnetic dipole moment 128 may be defined as the volume average of the magnetization times the volume of the magnet. In a strict mathematical sense the dipole moment 128 is obtained by integrating the magnetization vector over the total magnet volume. This dipole moment 128 may be measured by state of the art techniques (e.g., by vector vibrating sample magnetometers or Faraday balances). The magnet 120 should have a dipole moment 128 in the diametrical direction (i.e., in a single direction perpendicular to the rotation axis), which is stronger than the dipole moment 128 in the axial direction, which should preferably vanish. However, the magnetization may alternatively have an axial direction in one half of the geometry (0° . . . 180°) and an opposite direction in the other half of the geometry (180° . . . 360°). This magnetization pattern has no net dipole moment 128—it is a pure quadrupole. It is also possible to mix both types of magnetization (i.e., to mix dipole and quadrupole), such that the magnetization has My>0, Mz>0 in the half 0° . . . 180° and My>0, Mz<0 in the other half 180° . . . 360°.

Figure 3A:
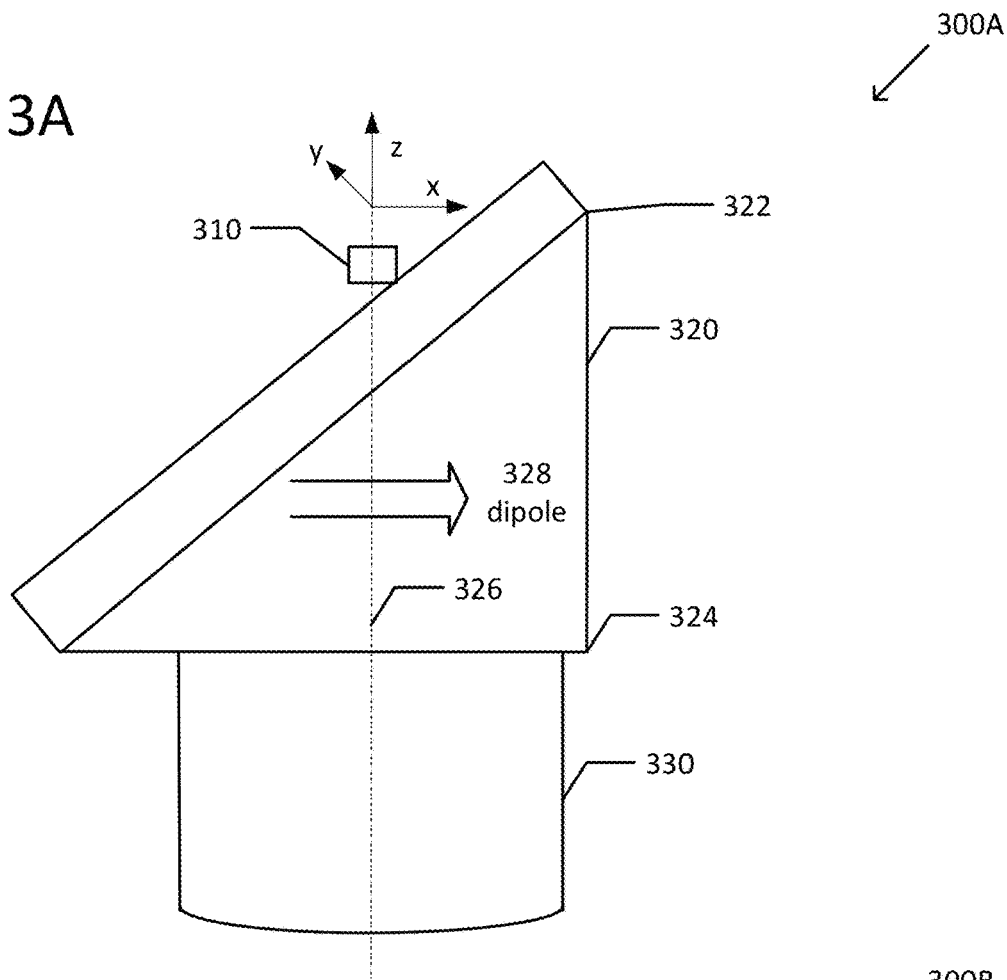
FIG. 3A illustrates a perspective view of a magnetic angle sensing system in accordance with another embodiment of this disclosure.
Figure 3B:
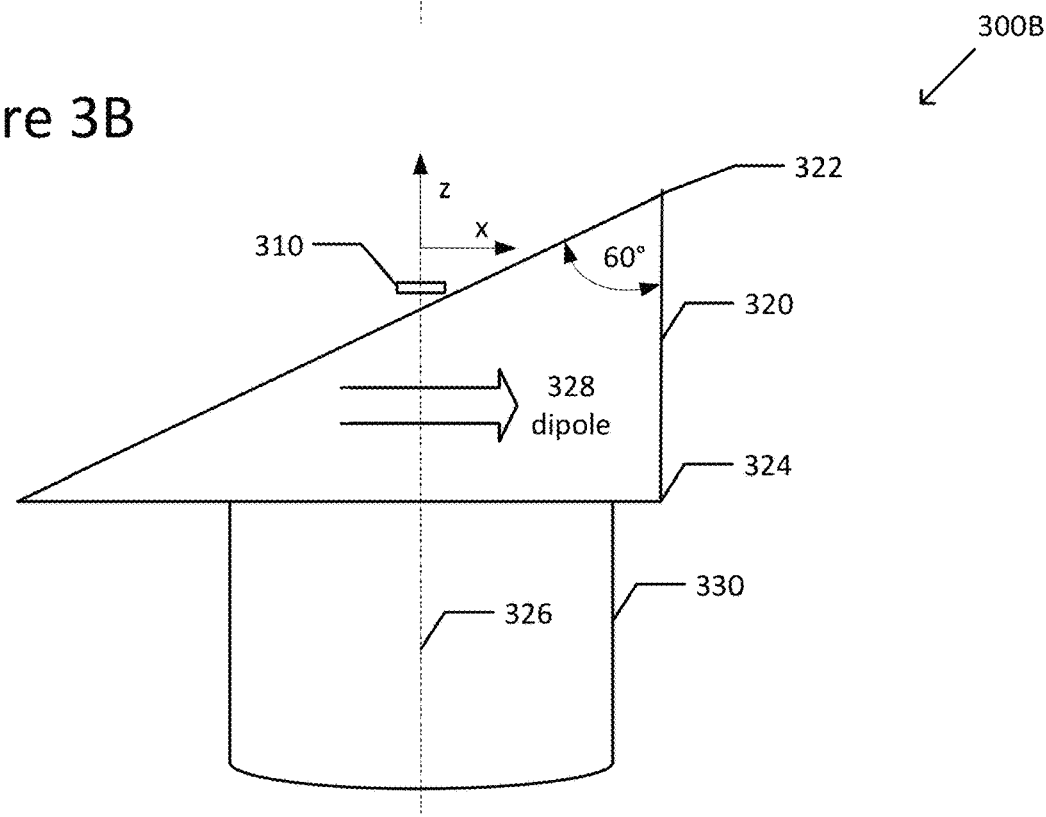
FIG. 3B illustrates an elevation view of the magnetic angle sensing system of FIG. 3A.

FIG. 3A illustrates a perspective view of a magnetic angle sensing system 300A in accordance with another embodiment of this disclosure. FIG. 3B illustrates an elevation view of the magnetic angle sensing system of FIG. 3A.

The magnetic angle sensing system 300 includes a magnetic field sensing element 310, a magnet 320, and a shaft 330. The magnetic angle sensing system 300 is similar to the magnetic field sensing system 100 of FIG. 1, except that the magnet 320 differs from the magnet 120 in that rather than being conical in shape, the magnet 320 is wedge-shaped. Unlike the cone, the wedge is not rotationally symmetrical.

The magnet 320 is rotatable around a rotation axis 326 and with respect to the magnetic field sensing element 310. The magnet 120 is wedged-shaped in that it has a tapered geometry with a thin end 322 located closer to the magnetic field sensing element 110 than a broad end 324.

The wedge-shaped magnet 320 has an aperture angle, which is defined between two slanted surfaces of the wedge shape, of approximately 60°. Also, the wedge-shaped magnet 320 has a dipole moment 328 that is perpendicular to the wedge-shaped magnet 320 and not parallel to the magnet 320's flat faces.

Figure 4A:
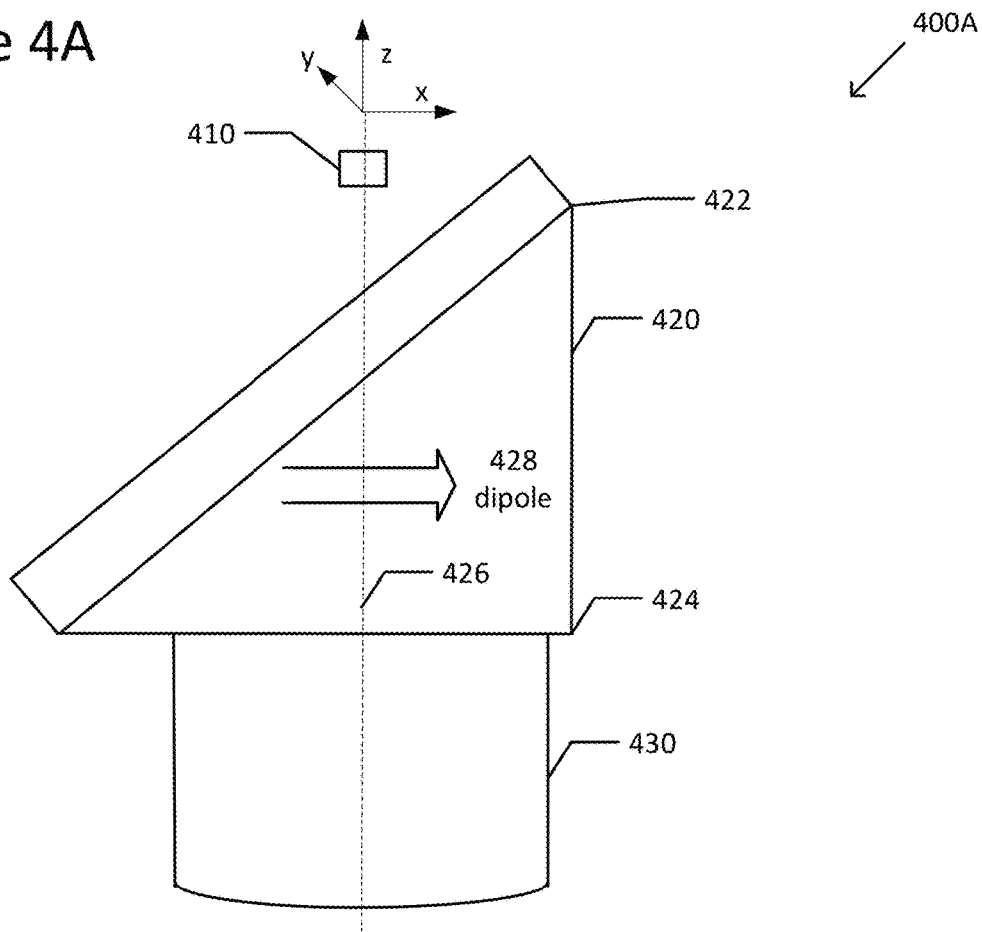
FIG. 4A illustrates a perspective view of a magnetic angle sensing system in accordance with another embodiment of this disclosure.
Figure 4B:
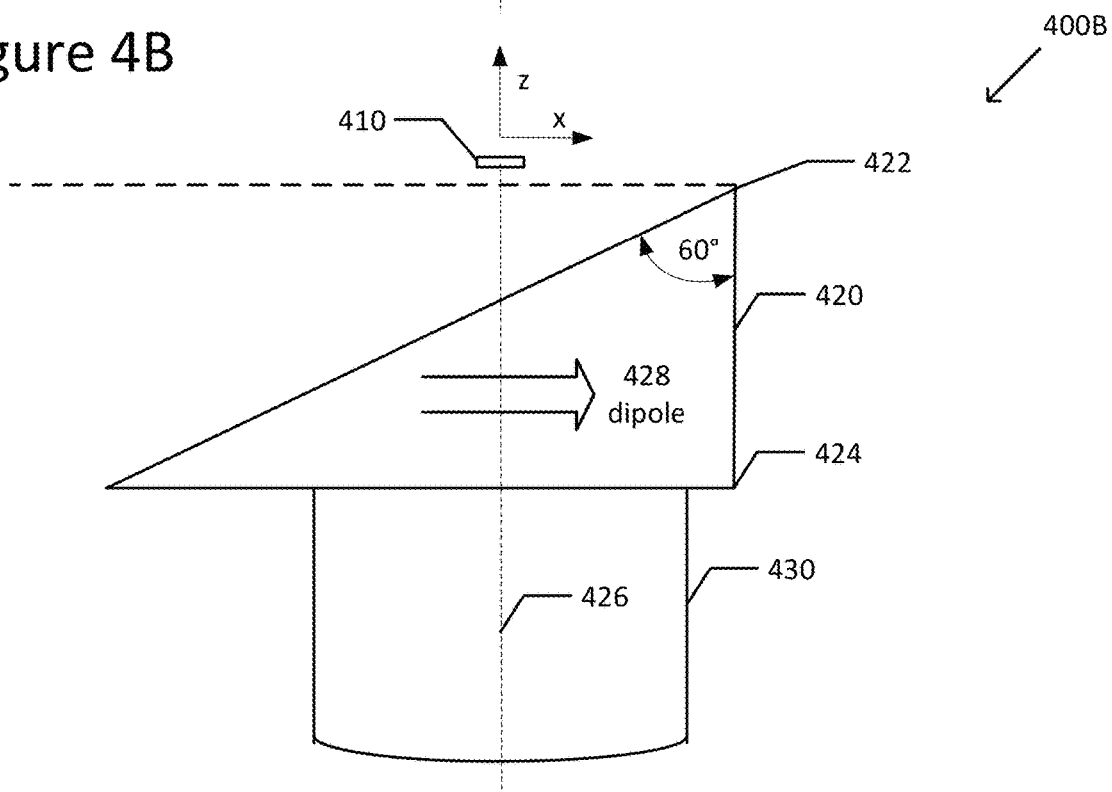
FIG. 4B illustrates an elevation view of the magnetic angle sensing system of FIG. 4A.

FIG. 4A illustrates a perspective view of a magnetic angle sensing system in accordance with another embodiment of this disclosure. FIG. 4B illustrates an elevation view of the magnetic angle sensing system of FIG. 4A.

The magnetic angle sensing system 400 includes a magnetic field sensing element 410, a magnet 420, and a shaft 430. The magnetic angle sensing system 400 is similar to the magnetic field sensing system 300 of FIG. 3, except that the sensing element 410 is located further from the magnet 320 as compared with the sensing element 310.

Figure 5A:
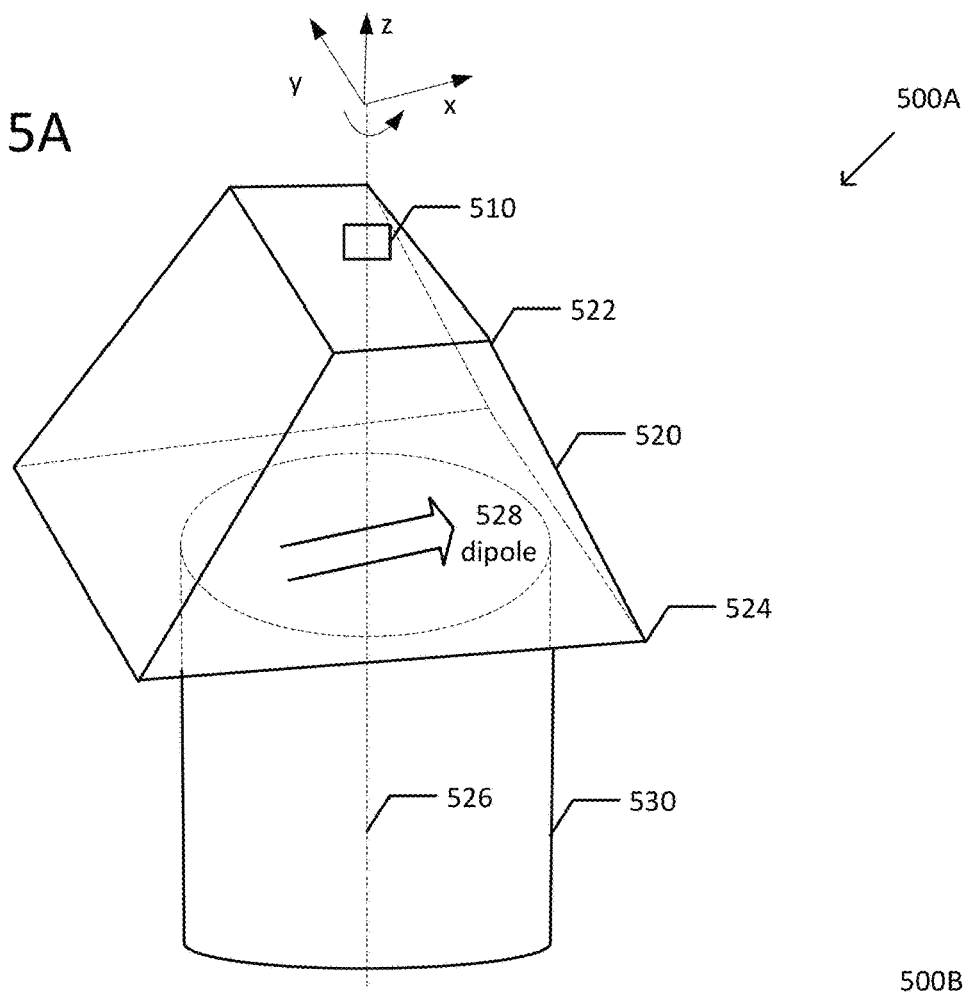
FIG. 5A illustrates a perspective view of a magnetic angle sensing system in accordance with another embodiment of this disclosure.
Figure 5B:
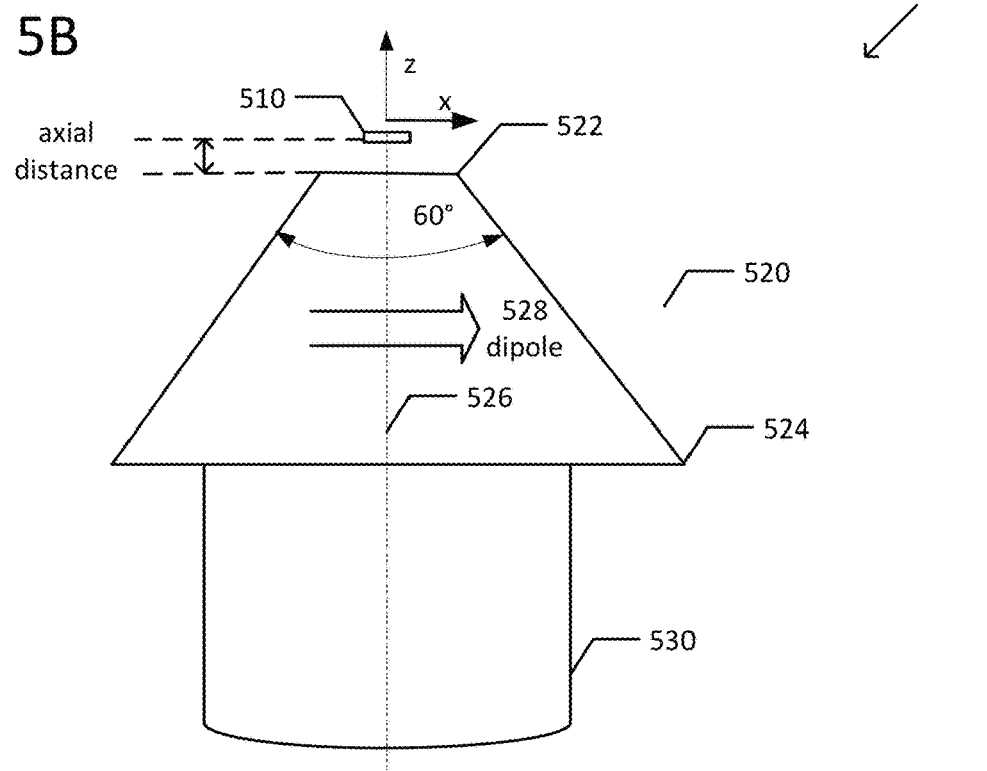
FIG. 5B illustrates an elevation view of the magnetic angle sensing system of FIG. 5A.

FIG. 5A illustrates a perspective view of a magnetic angle sensing system in accordance with another embodiment of this disclosure. FIG. 5B illustrates an elevation view of the magnetic angle sensing system of FIG. 5A.

The magnetic angle sensing system 500 includes a magnetic field sensing element 510, a magnet 520, and a shaft 530. The magnetic angle sensing system 500 is similar to the magnetic field sensing system 300 of FIG. 3, except that the magnet 520 has a quadratic cross-section in the x-y base-plane with the rotation axis 526 running along the z-axis. Also, the magnet 520 has mirror symmetry with respect to a plane perpendicular with the rotation axis 526, that is, the x-y plane.

The quadratic cross-section depends on the magnet 520's height, that is, where the wedge-shape is cut. If the wedge-shaped magnet 520 is cut it near its tip, the rectangular cross-section is slim. On the other hand, if the wedge-shaped magnet 520 is cut far from its tip, that is, near its base plane, then the rectangular cross-section is more stout, and may be quadratic. A square uses less space during rotation, while a slim rectangle uses more space.

While the foregoing has been described in conjunction with exemplary embodiment, it is understood that the term "exemplary" is merely meant as an example, rather than the best or optimal. Accordingly, the disclosure is intended to cover alternatives, modifications and equivalents, which may be included within the scope of the disclosure.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This disclosure is intended to cover any adaptations or variations of the specific embodiments discussed herein.

What is claimed is:

1. A magnet for a magnetic angle sensing system, comprising:
    a pyramidal geometry that is symmetrical with respect to a rotation axis of the magnet,
    wherein the magnet is a one-piece magnet homogeneously magnetized diametrically with respect to the rotation axis, and is configured to be mounted directly to a rotatable member such that a thin end of the magnet is closer to a magnetic field sensing element than a broad end of the magnet, and the magnetic field sensing element is centered above the thin end of the pyramidal geometry such that the rotation axis passes therethrough.

2. The magnet of claim 1, wherein the dipole moment of the magnet in the diametrical direction is larger than the dipole moment in the axial direction.

3. The magnet of claim 1, wherein the magnet is comprised of anisotropic NdFeB.

4. The magnet of claim 1, wherein the magnet is a rare-earth magnet.

5. The magnet of claim 1, wherein the magnet is a sintered magnet.

6. The magnet of claim 1, wherein the magnet comprises an anisotropic permanent magnetic material.

7. The magnet of claim 1, wherein the magnetic field sensing element is a single magnetic field sensing element.

8. The magnet of claim 1, wherein the magnet has a truncated pyramidal geometry.

9. A magnetic angle sensing system, comprising:
    a magnetic field sensing element configured to sense a magnetic field; and
    a magnet that is rotatable at a rotation axis and with respect to the magnetic field sensing element, is a one-piece magnet homogeneously magnetized diametrically with respect to the rotation axis, and has a pyramidal geometry that is symmetrical with respect to the rotation axis with a thin end located closer to the magnetic field sensing element than a broad end, and wherein the magnetic field sensing element is centered above the thin end of the pyramidal geometry such that the rotation axis passes therethrough.

10. The magnetic angle sensing system of claim 9, wherein the dipole moment of the magnet in the diametrical direction is larger than the dipole moment in the axial direction.

11. The magnetic angle sensing system of claim 9, further comprising:
    a rotatable shaft, wherein the broad end of the magnet is mounted directly to an end of the rotatable shaft.

12. The magnetic angle sensing system of claim 11, wherein the broad end of the magnet is mounted to the end of the rotatable shaft by glue.

13. The magnetic angle sensing system of claim 11, wherein the rotatable shaft is non-magnetic.

14. The magnetic angle sensing system of claim 11, wherein the rotatable shaft has an axial thickness of more than 8 mm.

15. The magnetic angle sensing system of claim 9, wherein the magnet is comprised of anisotropic NdFeB.

16. The magnetic angle sensing system of claim 9, wherein the magnet applies a maximum magnetic field to a magnetoresistive angle sensor on a plain surface perpendicular to the rotation axis.

17. The magnetic angle sensing system of claim 9, wherein the magnetic field sensing element is an XMR angle sensor selected from the group of angle sensors consisting of: anisotropic magnetoresistance (AMR), Giant magnetoresistance (GMR), and tunnel magnetoresistance (TMR) angle sensors.

18. The magnetic angle sensing system of claim 9, wherein the magnetic field sensing element is a Vertical Hall device.

19. The magnetic angle sensing system of claim 9, wherein the magnetic field sensing element is a single magnetic field sensing element.

20. The magnetic angle sensing system of claim 9, wherein the magnet has a truncated pyramidal geometry.

\* \* \* \* \*